United States Patent [19]

Yu et al.

[11] Patent Number: 4,802,054

[45] Date of Patent: Jan. 31, 1989

[54] INPUT PROTECTION FOR AN INTEGRATED CIRCUIT

[75] Inventors: Ruey J. Yu, Austin; Fu T. Liou, Irving, both of Tex.

[73] Assignee: Motorola, Inc., Schaumburg, Ill.

[21] Appl. No.: 25,427

[22] Filed: Mar. 13, 1987

[51] Int. Cl.⁴ .................................................. H02H 3/20

[52] U.S. Cl. .......................................... 361/91; 361/58; 357/23.13; 357/59; 330/207 P

[58] Field of Search .................... 361/58, 91, 100, 110, 361/111; 357/23.13, 41, 51, 59; 330/207 P, 298

[56] References Cited

U.S. PATENT DOCUMENTS

| | | | |
|---|---|---|---|
| 4,057,844 | 11/1977 | Smedley | 361/111 |
| 4,086,642 | 4/1978 | Yoshida et al. | 361/58 X |
| 4,358,337 | 5/1983 | Asano et al. | 361/91 |
| 4,541,002 | 9/1985 | Shimada | 361/91 X |
| 4,692,834 | 9/1987 | Iwahashi et al. | 361/91 |

*Primary Examiner*—A. D. Pellinen
*Assistant Examiner*—Derek S. Jennings
*Attorney, Agent, or Firm*—James L. Clingan, Jr.

[57] ABSTRACT

An integrated circuit has an input protection circuit coupled between an input pad and an input circuit. The input pad receives a signal provided externally from the integrated circuit. The input circuit is responsive to the signal provided externally from the integrated circuit. The input protection circuit provides protection against electrostatic discharge (ESD). The input protection circuit includes two polysilicon resistors in parallel in which one has a greater width than the other. The greater width resistor will be the first to open under ESD stress leaving the other resistor to still provide a signal path between the input pad and the input circuit.

2 Claims, 1 Drawing Sheet

PAD
11
20
21
22
26
27
23
24

INPUT PROTECTION FOR AN INTEGRATED CIRCUIT

FIELD OF THE INVENTION

The present invention relates to integrated circuits, and more particularly, to input protection for an integrated circuit.

BACKGROUND OF THE INVENTION

Integrated circuits typically have input protection interposed between an input circuit and an input pad. The input pad receives a signal which is provided externally from the integrated circuit. The input circuit is designed to be responsive to the externally provided signal. The purpose of the input protection circuit is primarily for protecting the input circuit from an electrostatic discharge applied to the input pad. This is of particular significance in MOS integrated circuits. One of the advantages of MOS is very high input impedance of the gate of a MOS transistor. This results, however, in being particularly susceptible to damage by electrostatic discharge. The typical protection used includes a polysilicon resistor between the input pad and the input circuitry and a diode-connected transistor between the input circuit and ground. Another variation adds a diode-connected transistor between the positive power supply terminal and the input circuit. The polysilicon resistor provides a voltage drop which dissipates the energy of the electrostatic discharge. This voltage drop can generate enough heat to cause the polysilicon to rupture and thus be an open circuit for normal operation. Consequently, if the electrostatic discharge (ESD) exceeds the capability of the input polysilicon resistor, the input is no longer operational because there is an open circuit between the input pad and the input circuitry.

SUMMARY OF THE INVENTION

An object of the present invention is to provide improved input protection for an integrated circuit.

Another object of the invention is to provide an improved input protection circuit.

Yet another object of the invention is to provide an improved input protection circuit which uses a polysilicon resistor.

These and other objects are achieved in an integrated circuit having an input circuit for receiving a signal from an input pad and an input protection circuit interposed between the input circuit and the input pad. The input protection circuit comprises a first polysilicon resistor and a second polysilicon resistor. The first polysilicon resistor has a first width and a first length and is coupled between the input pad and the input circuit. The second polysilicon resistor has a second length and a second width and is coupled in parallel with the first polysilicon resistor. The second width is greater than the first width.

DESCRIPTION OF THE INVENTION

Figure 1:
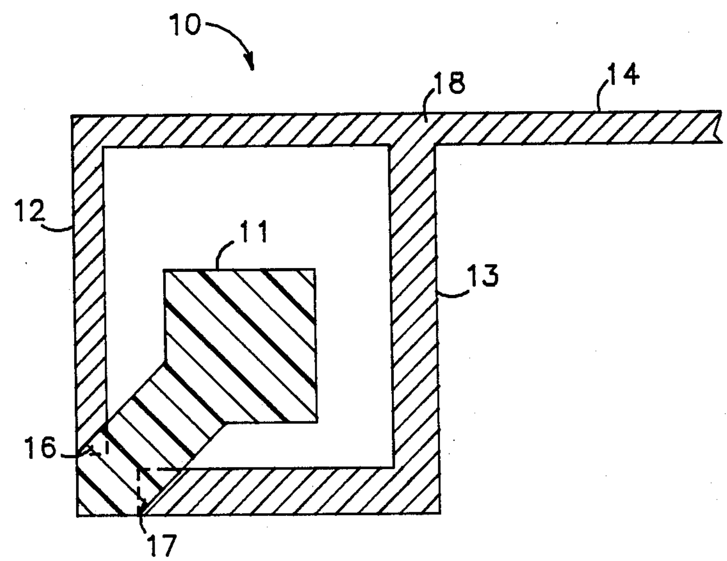
FIG. 1 is a layout of a portion of an input protection circuit according to a preferred embodiment of the invention.
Figure 2:
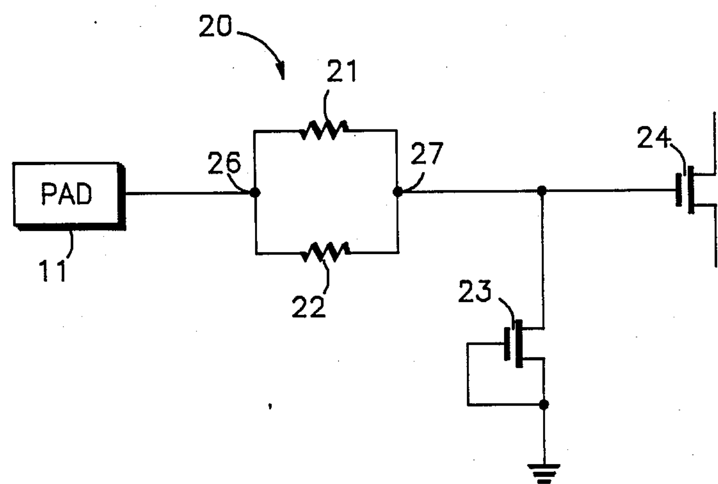
FIG. 2 is a circuit diagram of an input protection circuit according to the preferred embodiment of the invention.

Shown in FIG. 1 is an integrated circuit structure 10 comprised of a metal input pad 11, a polysilicon strip 12, a polysilicon strip 13, and a polysilicon strip 14. Metal input pad 11 is connected to polysilicon strip 12 at a connecting point 16 and to polysilicon strip 13 at a connecting point 17. Polysilicon strips 12–14 are commonly connected at an area 18. Polysilicon strips 12 and 13 are used as input polysilicon resistors as part of an input protection circuit 20 shown in FIG. 2. Input protection circuit 20 comprises metal input pad 11, a resistor 21, a resistor 22, and an N channel transistor 23. Also shown in FIG. 2 is an N channel transistor 24 as part of a typical input circuit. Resistor 21 has a first terminal connected to pad 11 at a node 26, and a second terminal connected to a node 27. Resistor 22 has a first terminal connected to pad 11 at node 26, and a second terminal connected to the second terminal of resistor 21 at node 27. Transistor 23 has a drain connected to the second terminals of resistors 21 and 22, and a gate and a source connected to ground. Polysilicon strip 12 forms resistor 21 and a polysilicon strip 13 forms resistor 22. Node 26 is formed by connecting points 16 and 17. Node 27 is formed by area 18. Polysilicon strip 14 connects the drain of transistor 23 to area 18 and forms the gate of transistor 24.

Pad 11 is for receiving a signal provided externally from integrated circuit structure 10. Resistors 21 and 22 are in parallel so that the effective resistance between pad 11 and node 27 is less than the resistance of either resistor 21 or resistor 22. The externally provided signal is coupled to the gate of transistor 24 via resistors 21 and 22. Resistors 21 and 22 and transistor 23 are for protecting transistor 24 from being damaged as result of an electrostatic discharge (ESD) applied to pad 11. There is additional circuitry (not shown) coupled to transistor 24 which, along with transistor 24, is designed to be responsive to the externally provided signal.

To test for susceptibility to ESD damage, a capacitor is charged to a predetermined voltage and discharged into the particular input that is being tested. The charge that is released is then divided between resistors 21 and 22. Resistor 22 has a lower resistance than resistor 21. Polysilicon strip 13 is wider than polysilicon strip 12 but they traverse the same distance to area 18. Consequently, resistor 22 has a lower resistance than resistor 21. More current thus flows through resistor 22 than through resistor 21. Appearance would indicate that although the current is greater through resistor 13, the current density would be the same through both resistors so that they would be equally likely to open under test. Experiments have shown otherwise.

The wider polysilicon strip has been shown to open first. In this case, resistor 22 will become an open circuit when the ESD stress becomes too great. Resistor 21, however, remains intact. The input of the integrated circuit thus remains operational although the input protection has had some destruction. In normal input protection circuits, once the ESD has become destructive, the input is no longer operational, and thus the integrated circuit is no longer operational. The parallel resistors 21 and 22 thus provide a result, which is an advantageous one, in addition to the normal reduction in resistance of two resistors in parallel. Furthermore, since the wider polysilicon resistor, which is lower in resistance, fails first. Thus, having the two resistors of different resistance guards against simultaneous failure of the two resistors.

Having two resistors in parallel provides more total surface area for dissipating the heat generated by the current through polysilicon resistors 21 and 22. It has been found that the center of the polysilicon is the hottest part of the resistor at least partially because the area adjoining the polysilicon absorbs some of the heat. With more surface area there is more opportunity to dissipate the heat which is generated by the current flowing through polysilicon strips 12 and 13.

There is another advantageous characteristic of the structure of FIG. 1 that has been discovered. When polysilicon strip 13 opens under an ESD test, there is a small area in strip 13 in which there is no polysilicon. Under a subsequent ESD test, there can be arcing across this area which diverts some of the current away from strip 12. This can result in strip 12 not opening and thus this ESD test also not causing a failure of the input. Thus an ESD, which would destroy the integrity of strip 12 if strip 12 were the only input resistor, may not in fact do so because of the arcing across the open area in polysilicon strip 13. It has been found that after the initial failure of strip 13, there can be ESD tests which would cause strip 12 alone to fail which do not in fact cause strip 12 to fail because of the arcing across the open area of strip 13. Consequently, even after strip 13 has experienced a destructive ESD, strip 13 offers some help in ESD protection.

We claim:

1. An integrated circuit, comprising:

an input circuit having at least an input transistor with a gate, source, and drain;

an input pad for receiving a signal external to the integrated circuit;

a first resistor having a first terminal coupled to the input pad, and a second terminal coupled to the gate of the input transistor, said first resistor being a polysilicon strip having a first length and a first width;

a second resistor having a first terminal coupled to the input pad, and a second terminal coupled to the gate of the input transistor, said second resistor being a polysilicon strip having a second length and a second width, said second width being greater than said first width whereby said first resistor has a greater resistance than that of said second resistor; and a diode-connected transistor coupled between the gate of the input transistor and a first power supply terminal.

2. The integrated circuit of claim 1 wherein the second length and the first length are the same.

* * * * *